US012604698B2

(12) United States Patent　　(10) Patent No.: US 12,604,698 B2

Kodama　　(45) Date of Patent: Apr. 14, 2026

(54) SUBSTRATE PROCESSING SYSTEM AND STATE MONITORING METHOD

(71) Applicant: Tokyo Electron Limited, Tokyo (JP)

(72) Inventor: Toshiaki Kodama, Nirasaki City (JP)

(73) Assignee: Tokyo Electron Limited, Tokyo (JP)

( * ) Notice: Subject to any disclaimer, the term of this patent is extended or adjusted under 35 U.S.C. 154(b) by 158 days.

(21) Appl. No.: 17/446,477

(22) Filed: Aug. 31, 2021

(65) Prior Publication Data

US 2022/0068672 A1　Mar. 3, 2022

(30) Foreign Application Priority Data

Sep. 2, 2020　(JP) ................................. 2020-147364

(51) Int. Cl.
| | |
|---|---|
| *H01L 21/677* | (2006.01) |
| *G01B 9/00* | (2006.01) |
| *H01J 37/305* | (2006.01) |
| *H01J 37/32* | (2006.01) |
| *H01L 21/67* | (2006.01) |

(52) U.S. Cl.
CPC .......... H01L 21/67069 (2013.01); G01B 9/00 (2013.01); H01J 37/3053 (2013.01); H01J 37/32642 (2013.01); H01L 21/67253 (2013.01); H01L 21/67739 (2013.01)

(58) Field of Classification Search
CPC .......... H01L 21/67069; H01L 21/67253; H01J 37/32642
See application file for complete search history.

(56) References Cited

U.S. PATENT DOCUMENTS

| | | | | | |
|---|---|---|---|---|---|
| 3,940,608 | A | * | 2/1976 | Kissinger ............... | G01D 5/268 |
| | | | | | 385/115 |
| 4,272,156 | A | * | 6/1981 | Ishibashi .................. | A61B 1/07 |
| | | | | | 600/177 |
| 10,014,198 | B2 | * | 7/2018 | Richardson ....... | H01L 21/67253 |
| 2001/0012108 | A1 | * | 8/2001 | Holzapfel ............... | B24B 49/00 |
| | | | | | 257/E21.53 |

(Continued)

FOREIGN PATENT DOCUMENTS

| | | |
|---|---|---|
| JP | H09-102531 A | 4/1997 |
| JP | 2016-100407 A | 5/2016 |

(Continued)

*Primary Examiner* — Parviz Hassanzadeh
*Assistant Examiner* — Margaret Klunk
(74) *Attorney, Agent, or Firm* — Armstrong Teasdale LLP

(57) ABSTRACT

A substrate processing system includes a substrate processing apparatus configured to process a substrate, a substrate transfer mechanism including a substrate holder configured to hold the substrate, an imaging device provided in the substrate transfer mechanism and configured to image a monitoring target member inside the substrate processing apparatus, and a controller. The controller is configured to cause the imaging device to image multiple portions of the monitoring target member, including a central portion facing a center of the substrate during processing and a peripheral edge portion facing a peripheral edge side of the substrate during the processing, by moving the substrate holder, and calculate, for each of the multiple portions of the monitoring target member, a physical amount indicating a state of the corresponding portion based on an imaging result.

12 Claims, 5 Drawing Sheets

(56) References Cited

U.S. PATENT DOCUMENTS

| | | | | |
|---|---|---|---|---|
| 2006/0157698 A1* | 7/2006 | Miyajima | ......... | H01L 21/67288 |
| | | | | 257/48 |
| 2007/0100580 A1* | 5/2007 | Marcus | .................. | H01L 22/12 |
| | | | | 702/170 |
| 2008/0071408 A1* | 3/2008 | Hiroki | .................. | H01L 21/681 |
| | | | | 700/114 |
| 2011/0140719 A1* | 6/2011 | Lee | .................. | H01J 37/32174 |
| | | | | 324/679 |
| 2015/0194330 A1* | 7/2015 | Sasaki | .............. | H01L 21/68792 |
| | | | | 361/234 |
| 2015/0214009 A1* | 7/2015 | Glukhoy | ........... | H01J 37/32091 |
| | | | | 239/132.3 |
| 2015/0217456 A1* | 8/2015 | Tsuji | ................ | H01L 21/68707 |
| | | | | 156/273.1 |
| 2016/0216185 A1* | 7/2016 | Gottscho | ........... | H01J 37/32935 |
| 2017/0069517 A1* | 3/2017 | Goto | ................. | H01L 21/67766 |
| 2018/0040460 A1* | 2/2018 | Gottscho | ........... | H01J 37/32935 |
| 2019/0120775 A1* | 4/2019 | Sawlani | ................ | G02B 5/208 |
| 2019/0291214 A1* | 9/2019 | Peng | ................. | B23K 26/0622 |
| 2020/0094370 A1* | 3/2020 | Cherian | ................ | G06N 3/084 |

FOREIGN PATENT DOCUMENTS

| | | |
|---|---|---|
| JP | 2017-175138 A | 9/2017 |
| JP | 2018-182217 A | 11/2018 |
| KR | 10-2017-0035840 A | 3/2017 |
| KR | 10-2019-0067105 A | 6/2019 |

\* cited by examiner

203c

W

310

203b(203)

303c(303)

114a     Im

SUBSTRATE PROCESSING SYSTEM AND STATE MONITORING METHOD

CROSS-REFERENCE TO RELATED APPLICATION

This application is based upon and claims the benefit of priority from Japanese Patent Application No. 2020-147364, filed on Sep. 2, 2020, the entire contents of which are incorporated herein by reference.

TECHNICAL FIELD

The present disclosure relates to a substrate processing system and a state monitoring method.

BACKGROUND

Patent Document 1 discloses a measurement system for measuring an amount of a focus ring consumed in a plasma etching apparatus including a processing container, a placement stage, and the focus ring. The measurement system includes a sensor board provided with a distance sensor and a measurement device configured to measure the consumption amount of the focus ring. In this system, the measurement device includes a transfer instruction part configured to instruct a transfer apparatus to transfer the measurement device into the processing container, an acquisition part configured to acquire physical quantity information according to a distance from the distance sensor to the focus ring measured by the distance sensor, and a measurement part configured to measure the consumption of the focus ring on the basis of the acquired physical quantity information.

PRIOR ART DOCUMENT

Patent Document

Patent Document 1: Japanese Laid-Open Patent Publication No. 2016-100407

SUMMARY

According to one embodiment of the present disclosure, there is provided a substrate processing system including a substrate processing apparatus configured to process a substrate, a substrate transfer mechanism including a substrate holder configured to hold the substrate, the substrate transfer mechanism being configured to hold the substrate on the substrate holder and to load and unload the substrate into and out of the substrate processing apparatus, an imaging device provided in the substrate transfer mechanism and configured to image a monitoring target member inside the substrate processing apparatus, and a controller. The controller is configured to cause the imaging device to image multiple portions of the monitoring target member, including a central portion facing a center of the substrate during processing and a peripheral edge portion facing a peripheral edge side of the substrate during the processing, by moving the substrate holder, and calculate, for each of the multiple portions of the monitoring target member, a physical amount indicating a state of the corresponding portion based on an imaging result.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
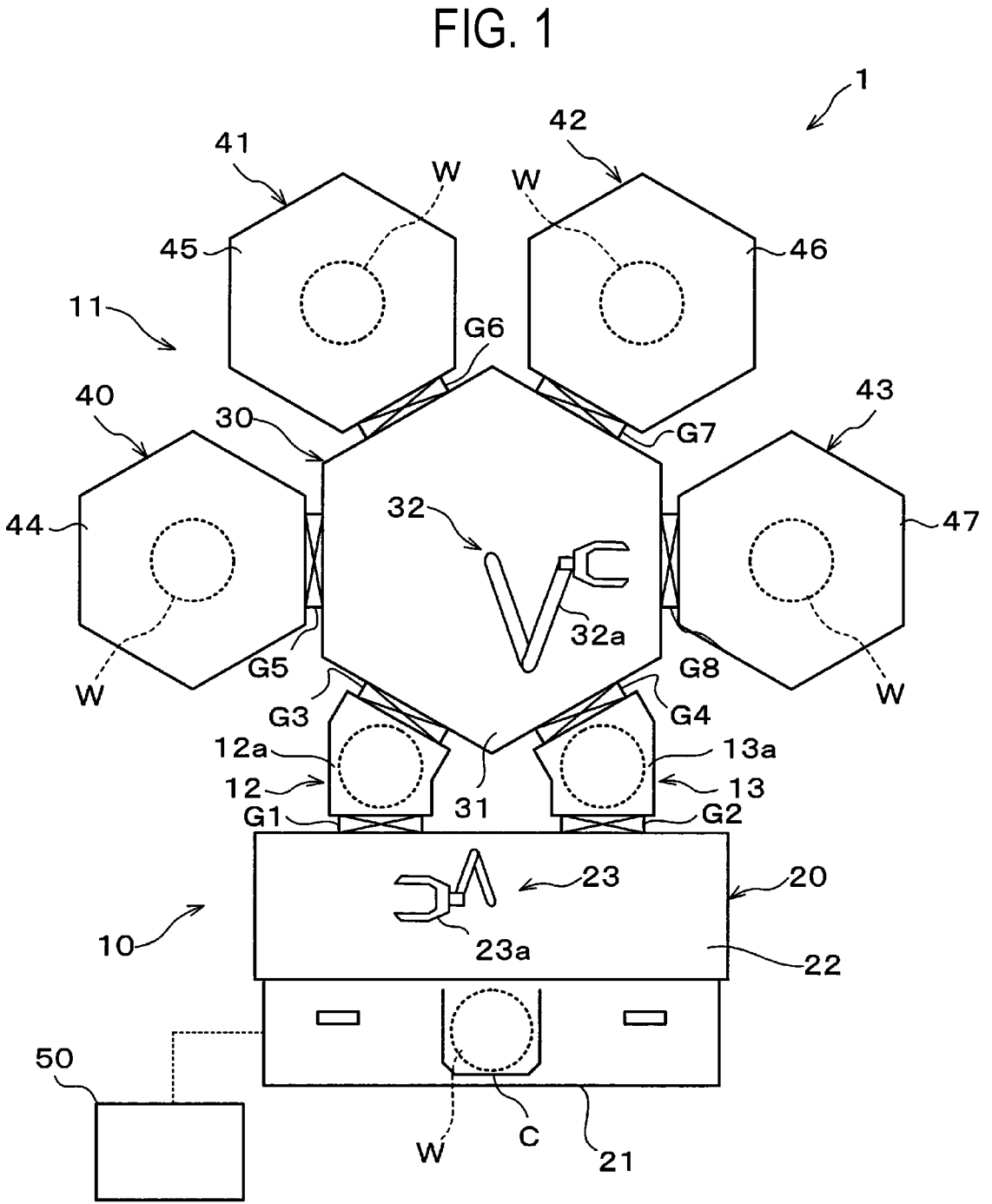
FIG. 1 is a plan view illustrating a schematic configuration of a wafer processing system as a substrate processing system according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

For example, in a process of manufacturing a semiconductor device or the like, a predetermined process, such as a film forming process or an etching process, is performed on a substrate such as a semiconductor wafer (hereinafter, referred to as a "wafer") by a substrate processing apparatus.

The state of a member inside this substrate processing apparatus changes as the above-mentioned processes are repeated. For example, in a substrate processing apparatus that performs an etching process, a shower head provided with a plurality of ejection holes for ejecting a processing gas towards a substrate is provided so as to face the substrate. However, since the ejection holes are also etched by the etching process performed on the substrate, the diameter of the ejection holes gradually increases. In addition, when inside of the substrate processing apparatus is exposed to an air atmosphere in order to check a state of each member inside the substrate processing apparatus, it takes a long time to return the inside of the substrate processing apparatus to a vacuum atmosphere.

In relation to this point, Patent Document 1 discloses a method of measuring the consumption amount of the focus ring provided inside the processing container of a plasma etching apparatus using a sensor board provided with a distance sensor.

The change in the state of a member inside the substrate processing apparatus due to the repetition of a predetermined process, such as an etching process, differs between the central portion facing the center of the substrate and the peripheral portion facing the peripheral edge side of the substrate during a predetermined process. For example, when an etching process using plasma is performed, the plasma density above the center of the substrate may be high and the plasma density above the peripheral edge side of the substrate may be low. In this case, the etching amount of the processing gas ejection holes is larger at the central portion of the shower head than at the peripheral edge portion. Therefore, regarding a member inside the substrate processing apparatus, an appropriate result may not be obtained when the state of only a portion facing a part of the substrate in the radial direction is monitored and on the basis of the monitoring results, the time for replacement of the member is determined or processing conditions are adjusted.

Therefore, with the technique according to the present disclosure, an appropriate result is obtained when determining the time for replacement of the above-mentioned member or the like on the basis of a monitoring result, even when the state of the member differs between the central portion and the peripheral portion in the case in which the state of the member is monitored without exposing the inside of the substrate processing apparatus to an air atmosphere.

Hereinafter, a substrate processing system and a state monitoring method according to the present embodiment will be described with reference to the drawings. In the specification and drawings, elements having substantially the same functional configurations will be denoted by the same reference numerals and redundant descriptions will be omitted.

FIG. 1 is a plan view illustrating a schematic configuration of a wafer processing system 1 as a substrate processing system according to an embodiment.

The wafer processing system 1 of FIG. 1 performs a predetermined process, such as a film forming process, a diffusion process, or an etching process on a wafer W as a substrate under a reduced pressure. The wafer processing system 1 has a configuration in which a carrier station 10 in which a carrier C capable of accommodating a plurality of wafers W is loaded and unloaded and a processing station 11 including a plurality of various processing modules, each of which is configured to perform a predetermined process on a wafer W under a reduced pressure, are integrally connected with each other. The carrier station 10 and the processing station 11 are connected via two load-lock apparatuses 12 and 13.

The load-lock apparatuses 12 and 13 have respective load-lock chambers 12a and 13a configured to switch the interiors thereof between an atmospheric pressure state and a vacuum state. The load-lock apparatuses 12 and 13 are provided so as to connect an atmospheric transfer apparatus 20 and a vacuum transfer apparatus 30, which will be described later.

The carrier station 10 includes the atmospheric transfer apparatus 20 and a carrier placement stage 21. The carrier station 10 may be further provided with an orienter (not illustrated) configured to adjust the orientation of the wafers W.

The atmospheric transfer apparatus 20 includes a housing that forms an atmospheric transfer chamber 22, the interior of which is under an atmospheric pressure. The atmospheric transfer chamber 22 is connected to the load-lock chambers 12a and 13a of the load-lock apparatuses 12 and 13 via gate valves G1 and G2. A transfer mechanism 23 is provided in the atmospheric transfer chamber 22 to transfer the wafers W between the load-lock chambers 12a and 13a and the atmospheric transfer chamber 22 under the atmospheric pressure.

The transfer mechanism 23 includes a transfer arm 23a, and the transfer arm 23a is configured as, for example, an articulated arm provided with a wafer holding part configured to hold a wafer W at the tip end thereof. The transfer mechanism 23 is configured to transfer a wafer W while holding the wafer W using the transfer arm 23a.

The carrier placement stage 21 is provided on a side surface of the atmospheric transfer apparatus 20 opposite to the load-lock apparatuses 12 and 13. In the illustrated example, the carrier placement stage 21 is configured such that a plurality of (e.g., three) carriers C can be placed thereon. The wafers W in the carriers C placed on the carrier placement stage 21 are loaded and unloaded into and out of the atmospheric transfer chamber 22 by the transfer arms 23a of the transfer mechanism 23 of the atmospheric transfer apparatus 20.

The processing station 11 includes a vacuum transfer apparatus 30 and processing apparatuses 40 to 43.

The vacuum transfer apparatus 30 has a vacuum transfer chamber 31, the interior of which is maintained at a reduced pressure state (a vacuum state). The vacuum transfer chamber 31 is configured as a housing that is sealable, and is formed so as to have, for example, a substantially polygonal shape (a hexagonal shape in the illustrated example) in a plan view. The vacuum transfer chamber 31 is connected to the load-lock chambers 12a and 13a of the load-lock apparatuses 12 and 13 via the gate valves G3 and G4. In the vacuum transfer chamber 31, a wafer transfer mechanism 32 as a substrate transfer mechanism is provided to transfer wafers W between vacuum processing chambers 44 to 47 (described later) of the processing apparatuses 40 to 43. The wafer transfer mechanism 32 includes a transfer arm 32a. Details of the configuration of the wafer transfer mechanism 32 will be described later.

Outside the vacuum transfer chamber 31 of the vacuum transfer apparatus 30, the processing apparatuses 40 to 43 as substrate processing apparatuses and load-lock apparatuses 12 and 13 are arranged so as to surround the vacuum transfer chamber 31. The load-lock apparatus 12, the processing apparatuses 40 to 43, and the load-lock apparatus 13 are arranged in this order in the clockwise rotation direction in a plan view from, for example, the load-lock apparatus 12, and to face respective side surface portions of the vacuum transfer chamber 31.

Each of the processing apparatuses 40 to 43 performs a predetermined process, such as a film forming process, a diffusion process, or an etching process, on a wafer W under a reduced pressure. In the present embodiment, it is assumed that the processing apparatuses 40 to 43 perform an etching process using plasma. The processing apparatuses 40 to 43 have respective vacuum processing chambers 44 to 47, inside each of which an etching process is performed on a wafer W under a reduced pressure. The vacuum processing chambers 44 to 47 are connected to the vacuum transfer chamber 31 of the vacuum transfer apparatus 30 via gate valves G5 to G8, respectively. Details of the configuration of the processing apparatus 40 will be described later. Since the configurations of the processing apparatuses 41 to 43 are the same as that of the processing apparatus 40, description of the details thereof will be omitted.

In addition, the wafer processing system 1 includes a controller 50. The controller 50 comprises, for example, a computer including a CPU, a memory, or the like, and includes a program storage (not illustrated). The program storage stores a program for controlling the wafer processing in the wafer processing system 1 and a program for monitoring a state inside of each of the processing apparatuses 40 to 43. The program may be recorded in a computer-readable storage medium, and may be installed in the controller 50 from the storage medium. Some or all of the programs may be implemented by dedicated hardware (a circuit board).

Figure 2:
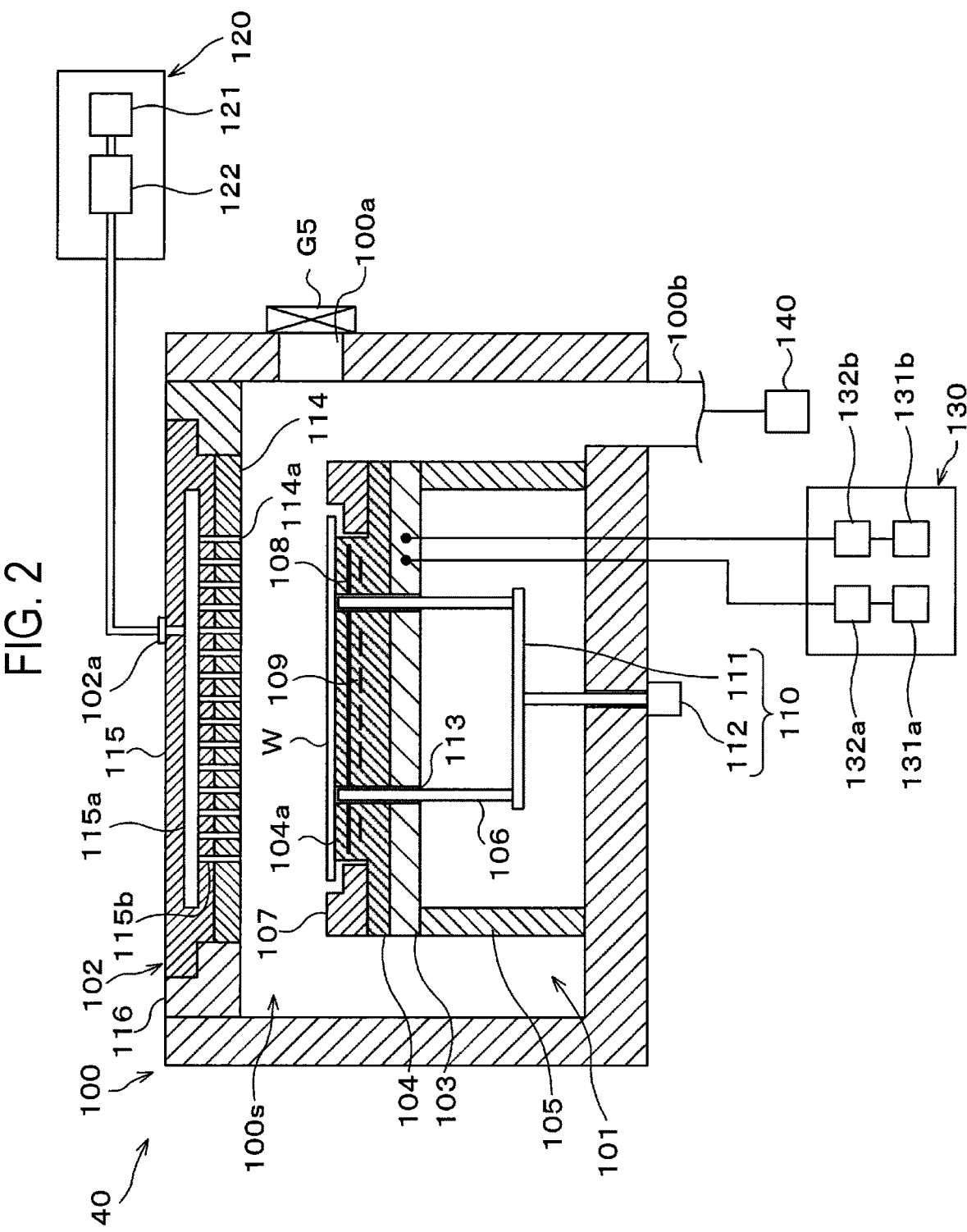
FIG. 2 is a vertical cross-sectional view illustrating a schematic configuration of a processing apparatus.
Figure 3:
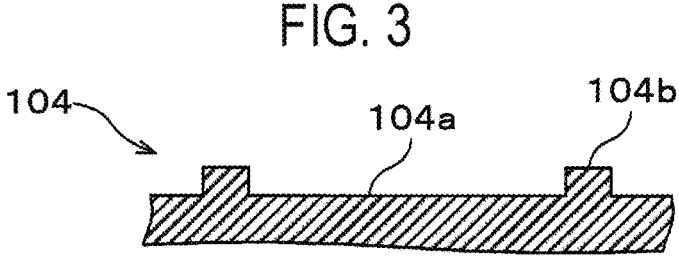
FIG. 3 is a partially enlarged cross-sectional view of an electrostatic chuck.

Next, a processing apparatus 40 will be described with reference to FIGS. 2 and 3. FIG. 2 is a vertical cross-sectional view illustrating a schematic configuration of the processing apparatus 40. FIG. 3 is a partially enlarged cross-sectional view of an electrostatic chuck to be described later.

As illustrated in FIG. 2, the processing apparatus 40 includes a processing container 100, a gas supplier 120, a radio frequency (RF) power supply 130, and an exhaust system 140. In addition, the processing apparatus 40 includes a support base 101 and a shower head 102.

The processing container 100 is a container, inside of which is configured to be decompressed, and constitutes a vacuum processing chamber 44. The processing container 100 has, for example, a substantially cylindrical shape. A side wall of the processing container 100 is provided with a loading and unloading port 100a of wafers W, and the loading and unloading port 100a is provided with a gate valve G5 configured to open and close the loading and unloading port 100a.

The support base 101 is disposed in a lower region of a plasma processing space 100s within the processing container 100. The shower head 102 is disposed above the support base 101 and serves as a part of a ceiling of the processing container 100.

The support base 101 is configured to support a wafer W in the plasma processing space 100s. The support base 101 includes a lower electrode 103, an electrostatic chuck 104 serving as an attractive holding member, an insulator 105, and a lifting pin 106.

The lower electrode 103 is made of a conductive material such as aluminum.

The electrostatic chuck 104 is provided on the lower electrode 103 and attracts and holds a wafer W by an electrostatic force. The electrostatic chuck 104 includes, at the center thereof, a placement portion 104a on a top surface of which a wafer W is placed. In the electrostatic chuck 104, the top surface of the placement portion 104a is formed to be higher than a top surface of an outer peripheral portion of the electrostatic chuck 104. A focus ring 107 is mounted on the top surface of the outer peripheral portion surrounding the placement portion 104a of the electrostatic chuck 104.

The focus ring 107 is an annular member disposed so as to surround the wafer W mounted on the placement portion 104a of the electrostatic chuck 104, and improves, for example, uniformity of a plasma process (a plasma etching process in this example). The focus ring 107 is formed of a material appropriately selected according to the plasma process to be performed, and is formed of, for example, silicon.

The placement portion 104a is provided with an electrode 108 configured to hold a wafer W through electrostatic attraction. The electrostatic chuck 104 has a configuration in which the electrode 108 is sandwiched between insulating materials. A DC voltage from a DC power supply (not illustrated) is applied to the electrode 108. Due to the electrostatic force generated thereby, a wafer W is attracted and held on the top surface of the placement portion 104a of the electrostatic chuck 104.

In the present embodiment, the placement portion 104a of the electrostatic chuck 104 on which a wafer W is placed and the portion on which the focus ring 107 is mounted are integrated, but these may be separate bodies.

The top surface of the placement portion 104a of the electrostatic chuck 104 is formed to have, for example, a diameter smaller than the diameter of the wafer W, and when the wafer W is placed on the top surface of the placement portion 104a, a peripheral edge of the wafer W protrudes from the placement portion 104a. Further, the focus ring 107 has a step formed on the upper portion thereof, so that the top surface of the outer peripheral portion thereof is formed to be higher than the top surface of the inner peripheral portion thereof. The focus ring 107 is formed such that the inner peripheral portion thereof is introduced below the peripheral edge of the wafer W protruding from the placement portion 104a. That is, the inner diameter of the focus ring 107 is formed to be smaller than the outer diameter of the wafer W.

In addition, below the electrode 108 in the electrostatic chuck 104, a heater 109 as a temperature adjustment mechanism for adjusting a temperature of the wafer W is embedded. The heater 109 heats the wafer W held by the electrostatic chuck 104 by heating the electrostatic chuck 104. The heater 109 is configured such that the temperature of each of multiple regions in the radial direction of the wafer W is independently adjustable. Specifically, the heater 109 includes, for example, a heater configured to heat a region at the center of the electrostatic chuck 104 in a plan view, and heaters configured to independently heat multiple respective annular regions arranged in order from a region at the center of the electrostatic chuck 104 in the plan view towards outside in the radial direction of the electrostatic chuck 104.

In addition, as illustrated in FIG. 3, a plurality of convex portions 104b are provided on the top surface of the placement portion 104a of the electrostatic chuck 104, for example, at equal intervals. This is to prevent the wafer W from being continuously attracted by the electrostatic chuck 104 due to a residual attractive force when the voltage application to the electrode 108 is stopped. The convex portions 104b are formed in a columnar shape having, for example, a diameter of 300 μm to 500 μm and a height of 5 μm to 30 μm.

As illustrated in FIG. 2, the insulator 105 supports the lower electrode 103. The insulator 105 is, for example, a cylindrical member having an outer diameter equivalent to the outer diameter of the lower electrode 103, and is made of ceramic or the like to support the peripheral edge side of the lower electrode 103.

The lifting pin 106 is a columnar member that is raised and lowered so as to protrude or retract from the top surface of the placement portion 104a of the electrostatic chuck 104, and is formed of, for example, ceramic. Three or more lifting pins 106 are provided at intervals from each other in the circumferential direction of the electrostatic chuck 104, specifically, the circumferential direction of the top surface of the placement portion 104a.

The lifting pins 106 are connected to a lifting mechanism 110 that raises and lowers the lifting pins 106. The lifting mechanism 110 includes, for example, a support member 111 configured to support the plurality of lifting pins 106, and a driving mechanism 112 configured to generate a driving force for lifting and lowering the support member 111 so as to raise and lower the plurality of lifting pins 106. The driving mechanism 112 includes an actuator such as a motor that generates a driving force.

The lifting pins 106 are inserted into respective through holes 113 extending downwards from the placement portion of the electrostatic chuck 104 to the bottom surface of the lower electrode 103. The upper end surfaces of the lifting pins 106 support the rear surface of the wafer W when the lifting pins 106 are raised.

The shower head 102 serves as an upper electrode, and also functions as a shower head that supplies a processing gas from the gas supplier 120 to the plasma processing space 100s. The shower head 102 includes an electrode plate 114 disposed so as to face the inside of the processing container 100 and a support 115 provided above the electrode plate 114. In addition, the shower head 102 is supported in the upper portion of the processing container 100 via an insulative blocking member 116.

A plurality of ejection holes 114a are formed in the electrode plate 114, for example, at equal intervals. The ejection holes 114a eject a processing gas or the like into the plasma processing space 100s. Specifically, the ejection holes 114a eject the processing gas towards the wafer W that is attracted to and held by the electrostatic chuck 104 during the plasma etching process. In addition, the ejection holes 114a eject a cleaning gas towards the electrostatic chuck 104 during cleaning of the processing apparatus 40. The electrode plate 114 is formed of, for example, silicon.

The support 115 detachably supports the electrode plate 114, and is formed of a conductive material such as aluminum. A gas diffusion chamber 115a is formed inside the support 115. A plurality of gas flow holes 115b communicating with the ejection holes 114a are formed from the gas diffusion chamber 115a.

The gas supplier 120 includes one or more gas supply sources 121 and one or more flow rate controllers 122. The gas supplier 120 supplies, for example, one or more processing gases or one or more cleaning gases from respective corresponding gas supply sources 121 to the gas diffusion chamber 115a via respective corresponding flow rate controllers 122. Each flow rate controller 122 is, for example, a pressure control type flow rate controller.

In the processing apparatus 40, a processing gas from a gas supply source 121 selected from one or more gas supply sources 121 is supplied to the gas diffusion chamber 115a via the flow rate controller 122. Then, the processing gas supplied to the gas diffusion chamber 115a is dispersed and supplied in the form of a shower in the plasma processing space 100s via the gas flow holes 115b and the ejection holes 114a.

The processing apparatus 40 is configured such that a supply flow rate of the processing gas from the shower head 102 is independently adjustable in each of a plurality of regions extending in the radial direction of the wafer W. For example, in the processing apparatus 40, although not illustrated, the gas diffusion chamber 115a is divided into three or more in the radial direction, and the gas diffusion chambers 115a adjacent to each other are separated by a partition wall. Thus, the pressure of the processing gas supplied from the gas supplier 120 to each gas diffusion chamber 115a is individually adjustable.

The RF power supply 130 includes, for example, two RF generators 131a and 131b and two matching circuits 132a and 132b. The RF generator 131a and the RF generator 131b are connected to the lower electrode 103 via the matching circuits 132a and 132b, respectively, and supply RF power to the lower electrode.

The RF generator 131a generates and supplies RF power for plasma generation. The frequency of the RF power from the RF generator 131a is, for example, 27 MHz to 100 MHz. The matching circuit 132a has a circuit for matching an output impedance of the RF generator 131a with an input impedance on the load (the lower electrode 103) side.

The RF generator 131b generates and supplies RF power for drawing ions into the wafer W (high-frequency bias power). The frequency of the RF power from the RF generator 131b is, for example, 400 kHz to 13.56 MHz. The matching circuit 132b has a circuit for matching the output impedance of the RF generator 131b with the input impedance on the load (the lower electrode 103) side.

The exhaust system 140 exhausts the inside of the plasma processing space 100s and includes a vacuum pump. The exhaust system 140 is connected to an exhaust port 100b provided in the bottom portion of the processing container 100.

Since the configurations of the processing apparatuses 41 to 43 are the same as the configuration of the processing apparatus 40, description thereof will be omitted.

Figure 4:
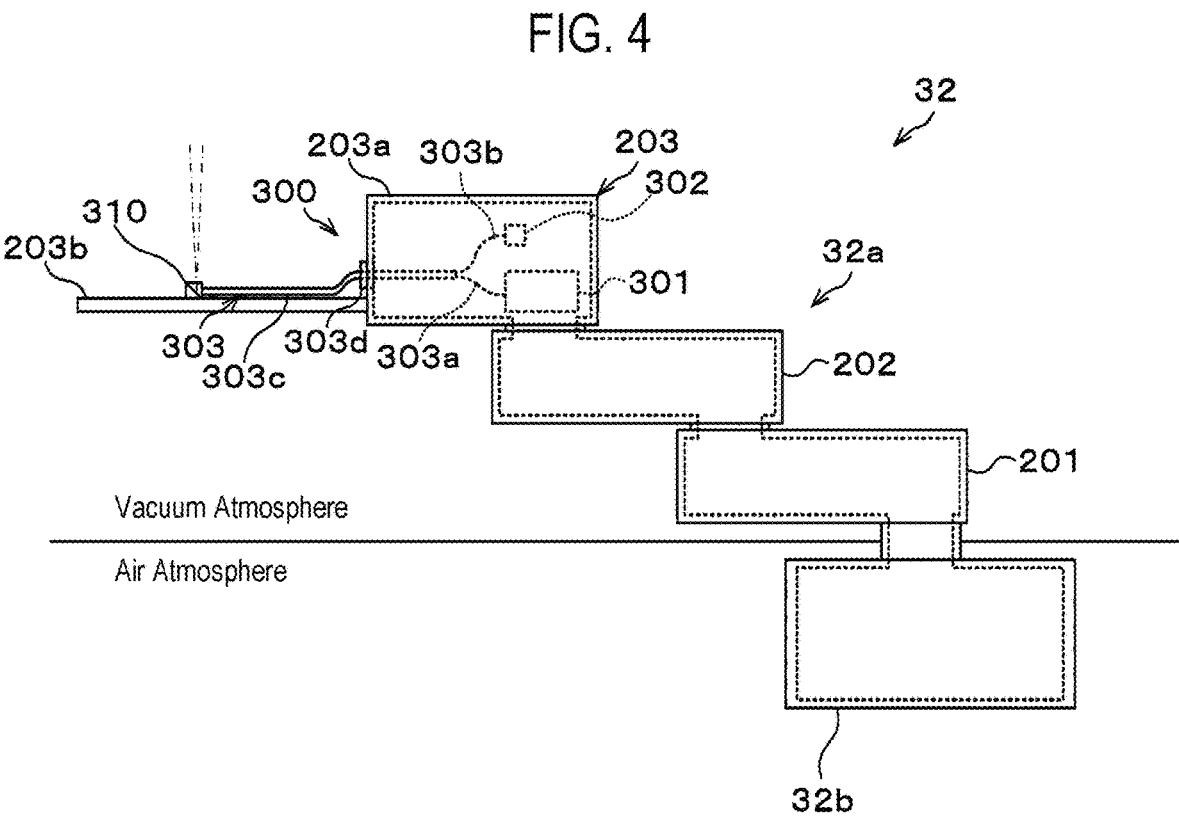
FIG. 4 is a side view schematically illustrating a configuration of a wafer transfer mechanism.
Figures 5, 6:
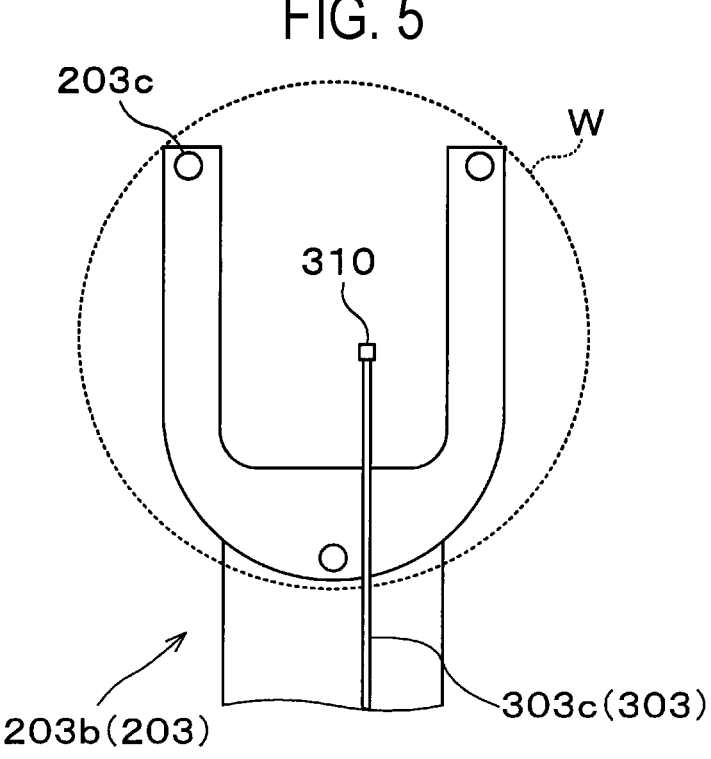
FIG. 5 is a top plan view illustrating a schematic configuration of a fork.
FIG. 6 is a schematic diagram illustrating an example of a captured image used in a process of monitoring an electrode plate of a processing apparatus.

Next, the wafer transfer mechanism 32 will be described with reference to FIGS. 4 and 5. FIG. 4 is a side view schematically illustrating the configuration of the wafer transfer mechanism 32. FIG. 5 is a top plan view illustrating a schematic configuration of a fork to be described later.

As illustrated in FIG. 4, the wafer transfer mechanism 32 includes a transfer arm 32a and a base 32b, and is configured to transfer a wafer W while holding the wafer W by the transfer arm 32a. A plurality of transfer arms may be provided in the wafer transfer mechanism 32.

The transfer arm 32a is configured as, for example, a multi joint arm. The base 32b pivotally supports the base end side of the transfer arm 32a.

The transfer arm 32a has a first joint arm 201, a second joint arm 202, and a holding arm 203 as a substrate holder for holding a wafer W. The base end side of the first joint arm 201 is connected to the base 32b to be rotatable around a vertical axis. The second joint arm 202 is connected to a tip end side of the first joint arm 201 to be rotatable about the vertical axis. The holding arm 203 is connected to a tip end side of the second joint arm 202 to be rotatable about the vertical axis.

The base 32b is provided with a driving mechanism (not illustrated) configured to drive raising and lowering, rotating, and expanding and contracting of the transfer arm 32a. This driving mechanism includes an actuator such as a motor that generates a driving force for raising and lowering the transfer arm 32a, a driving force for rotating the transfer arm 32a horizontally, and a driving force for expanding and contracting the transfer arm 32a in the horizontal direction.

The holding arm 203 includes an accommodation part 203a on the base end side thereof and the fork 203b on the tip end side thereof.

The inside of the accommodation part 203a is formed to be hollow.

As illustrated in FIG. 5, the fork 203b has a bifurcated shape having a width smaller than the diameter of the wafer W. On the top surface of the fork 203b, a plurality of protrusions 203c protruding upwards are provided at multiple locations (three locations in the example of the figure). The protrusions 203c support the bottom surfaces of the wafer W, for example, on top surfaces thereof.

When the transfer arm 32a is raised and lowered, the fork 203b is raised and lowered, and when the transfer arm 32a rotates or expands and contracts, the fork 203b moves in the horizontal direction.

Of the wafer transfer mechanism 32, the transfer arm 32a is located in the vacuum transfer chamber 31 having a vacuum atmosphere, or the like, and the base 32b is provided in the space having an air atmosphere below the vacuum transfer chamber 31.

In addition, insides of the base 32b, the first joint arm 201, and the second joint arm 202 are all hollow like the accommodation part 203a on the base end side of the holding arm 203. The space inside the accommodation part 203a of the holding arm 203 communicates with the space inside the base 32*b*, which has an air atmosphere, through the insides of the first joint arm 201 and the second joint arm 202.

The wafer transfer mechanism 32 configured as described above is controlled by the controller 50.

In addition, as illustrated in FIG. 4, the wafer transfer mechanism 32 is provided with an imaging unit 300. The imaging unit 300 includes an imaging device 301, a light source 302, a linear member 303, and a mirror 310.

The imaging device 301 images a member, that is, a monitoring target member, which is located in each of the processing apparatuses 40 to 43, and a state of which is to be monitored. An imaging result of the imaging device 301 is output to the controller 50 through, for example, wireless communication or wired communication.

The light source 302 serves to illuminate an imaging target of the imaging device 301, and has, for example, an LED.

The imaging device 301 and the light source 302 are provided inside the accommodation part 203*a* of the holding arm 203, which communicates with the space inside the base 32*b* to have an air atmosphere.

The linear member 303 is a member formed in a linear shape, and includes a first light guide member 303*a* configured to guide light that is emitted from the imaging target of the imaging device 301 and is incident from the tip end thereof to the base end thereof, and a second light guide member 303*b* configured to guide light that is emitted from the light source 302 and is incident from the base end thereof to the tip end thereof. The linear member 303 is disposed on the holding arm 203.

The first light guide member 303*a* includes, for example, an objective lens provided at the tip end thereof and an optical fiber. A plurality of relay lenses may be used instead of the optical fiber. The second light guide member 303*b* is, for example, an optical fiber. That is, the linear member 303 is used as a fiberscope or a borescope in the field of industrial endoscopes.

On the tip end side of the linear member 303, the first light guide member 303*a* and the second light guide member 303*b* are put together to form a linear composite cable 303*c*.

The linear member 303 is disposed such that the composite cable 303*c* penetrates the side wall of the accommodation part 203*a* of the holding arm 203. At a portion of the composite cable 303*c* that penetrates the side wall of the accommodation part 203*a*, a feedthrough 303*d* is formed such that a vacuum atmosphere in the vacuum transfer chamber 31 or the processing container 100 of each of the processing apparatuses 40 to 43 is not impaired.

In addition, as illustrated in FIG. 5, the linear member 303 is disposed such that the tip end thereof overlaps with the center of the wafer W held by the holding arm 203 in a plan view. More specifically, the linear member 303 is disposed such that the tip end of the composite cable 303*c* overlaps the center of the wafer W held by the holding arm 203 in a plan view.

Even in the state in which the linear member 303 is disposed in this way, the linear member 303 is formed and disposed linearly such that holding of the wafer W by the holding arm 203 is not disturbed. Specifically, in the linear member 303, the diameter of the composite cable 303*c* which is located between the fork 203*b* of the holding arm 203 and the wafer W when the wafer W is held by the fork 203*b* of the holding arm 203, is set to be smaller than the height of the protrusions 203*c*, and the tip end side of the composite cable 303*c* is disposed to extend in the horizontal direction along the top surface of the fork 203*b*. The diameter of the linear member 303 is, for example, 3 mm or less. As described above, the imaging device 301 and the light source 302 are provided inside the accommodation part 203*a* of the holding arm 203, and this position is a position at which the imaging device 301 does not interfere with the wafer W held by the holding arm 203.

The mirror 310 is provided at a position ahead of the tip end of the linear member 303, that is, at the position of the end of the composite cable 303*c* and overlapping the center of the wafer W held by the holding arm 203 in a plan view. The mirror 310 reflects upwards the light emitted from the light source 302 in the horizontal direction and emitted from the tip end of the second light guide member 303*b* of the composite cable 303*c*, and reflects the light from the upper side horizontally towards the tip end of the first light guide member 303*a* of the composite cable 303*c*. The mirror 310 is fixed to the linear member 303 by mounting, for example, a mounting member (not illustrated) that supports the mirror 310, on the tip end side of the linear member 303.

Even if the mirror 310 is provided in this way, the mirror 310 and the mounting member are disposed such that the holding of the wafer W by the holding arm 203 is not disturbed. Specifically, the height of each of the linear member 303 and the mounting member is smaller than the height of the protrusions 203*c*.

In the imaging unit 300, the light source 302 illuminates the imaging target of the imaging device 301, that is, the monitoring target member, via the second light guide member 303*b*. Specifically, the light source 302 illuminates the imaging target of the imaging device 301, that is, the monitoring target member, which is located above the fork 203*b*, via the second light guide member 303*b* and the mirror 310. In addition, in the imaging unit 300, the imaging device 301 receives the light, which is emitted from the imaging target, that is, the monitoring target member, and is guided by the first light guide member 303*a*, and captures an image. Specifically, the imaging device 301 receives the light, which is emitted from the imaging target, that is, the monitoring target member located above the fork 203*b*, reflected by the mirror 310, and guided by the first light guide member 303*a*, and captures an image.

Further, in the example illustrated in the figure, the tip end side of the composite cable 303*c* is not supported by the fork 203*b*. Even in this case, for example, a rigid wire rod may be bundled together with the first light guide member 303*a* such that the tip end of the composite cable 303*c* does not hang down due to its own weight. In addition, when the first light guide member 303*a* has a plurality of relay lenses, the wire rod may be omitted.

In the wafer processing system 1, a member within the processing apparatus 40, specifically, a member within the processing container 100 is taken as the monitoring target member. In this example, the electrode plate 114 located above the fork 203*b* when the holding arm 203 is inserted into the processing container 100 of any of the processing apparatuses 40 to 43 is taken as the monitoring target member. In the present disclosure, the "member within the processing apparatus 40" also includes a member, like the electrode plate 114, which has only a portion thereof facing the inside of the processing apparatus 40 (specifically, the inside of the processing container 100).

When monitoring the state of the electrode plate 114, the controller 50 causes the imaging device 301 to image multiple portions of the electrode plate 114, including the central portion facing the center of the wafer during the etching process and the peripheral edge portion facing the peripheral edge side of the wafer during the etching process, via the first light guide member 303a, by moving the holding arm 203 inside of the processing container 100. Then, for each of the multiple portions of the electrode plate 114, the controller 50 calculates the diameter (size) of the ejection holes 114a as a physical amount indicating the state of the corresponding portion on the basis of the imaging results by the imaging device 301. That is, the controller 50 acquires (the information of) the diameter of the ejection holes 114a in each of the multiple portions of the electrode plate 114 as the result of monitoring the state of the electrode plate 114 based on the imaging results by the imaging device 301.

In addition, the diameter of the ejection holes 114a is calculated as a physical quantity indicating the state of each portion of the electrode plate 114 because the ejection holes 114a are also etched during the etching process of the wafer W using plasma, as described above.

Furthermore, the controller 50 determines the time for replacement of the electrode plate 114 and changes the etching process conditions based on the calculation result of the physical quantity, that is, the result of monitoring the state of the electrode plate 114. Specifically, the controller 50 determines the time for replacement of the electrode plate 114 and changes the etching processing conditions based on the diameter of the ejection holes 114a in each of the multiple portions of the electrode plate 114.

When the electrode plate 114 is imaged by the imaging device 301 for monitoring the state of the electrode plate 114, the linear member 303 and the mirror 310 are inserted into the processing container 100 and are located above the support base 101. A heat-resistant material is used for the linear member 303 and the mirror 310 such that the radiant heat from the support base 101 heated by the heater 109 does not affect imaging of the imaging device 301.

Next, wafer processing performed using the wafer processing system 1 configured as described above will be described.

First, a wafer W is taken out from the carrier C by the transfer arm 23a of the transfer mechanism 23, and the gate valve G1 is opened. Thereafter, the wafer W is loaded into the load-lock apparatus 12 by the transfer arm 23a and delivered to a support part (not illustrated) in the load-lock apparatus 12.

Subsequently, the transfer arm 23a is pulled out from the load-lock apparatus 12, the gate valve G1 is closed, the inside of the load-lock apparatus 12 is sealed, and the pressure in the load-lock apparatus 12 is reduced.

When the pressure in the load-lock apparatus 12 becomes equal to or lower than a predetermined pressure, the gate valve G3 is opened, and the wafer W is received from the support part (not illustrated) in the load-lock apparatus 12 by the fork 203b of the wafer transfer mechanism 32 and is taken out of the load-lock apparatus 12.

Next, after the gate valve G3 is closed, the gate valve G5 for the processing apparatus (here, it is assumed that the processing apparatus 40 is used) that performs a target process is opened. Subsequently, the fork 203b holding the wafer W is inserted into the processing container 100 of the processing apparatus 40 having a reduced pressure, that is, the wafer W is loaded into the processing container 100 of the processing apparatus 40. Thereafter, the lifting pins 106 are raised and lowered, the fork 203b is pulled out from the processing container 100, and the wafer W is placed on the electrostatic chuck 104 within the processing container 100 via the lifting pins 106.

Subsequently, the gate valve G5 is closed, the processing container 100 of the processing apparatus 40 is sealed, and the inside of the processing container 100 is decompressed to a predetermined degree of vacuum by the exhaust system 140. In addition, a DC voltage is applied to the electrode 108 of the electrostatic chuck 104, whereby the wafer W is attracted to and held by the electrostatic chuck 104 by an electrostatic force.

Next, a processing gas is supplied from the gas supplier 120 to the plasma processing space 100s via the shower head 102. In addition, high-frequency power HF for plasma generation is supplied from the RF power supply 130 to the lower electrode 103, whereby the processing gas is excited and plasma is generated. At this time, the high-frequency power LF for attracting ions is also supplied from the RF power supply 130 to the lower electrode 103. Then, a plasma etching process is performed on the wafer W by the action of the generated plasma.

When the plasma etching process is completed, the supply of the high-frequency power HF and the high-frequency power LF from the RF power supply 130 and the supply of the processing gas from the gas supplier 120 are stopped. Next, the application of the DC voltage to the electrode 108 is stopped, and the attraction and holding of the wafer W by the electrostatic chuck 104 are stopped.

Thereafter, the gate valve G5 of the processing container 100 is opened, the fork 203b is moved into the processing container 100 of the processing apparatus 40, and the lifting pins 106 are raised and lowered so that the wafer W is received by the fork 203b. Then, the wafer W is unloaded from the processing container 100 of the processing apparatus 40 in a reverse procedure to the loading of the wafer W into the processing container 100 of the processing apparatus 40, and a series of wafer processes is completed.

Before the wafer W to be processed next is loaded into the processing container 100 of the processing apparatus 40, a cleaning gas is supplied to the processing container 100 and cleaning is performed.

Subsequently, an example of a process of monitoring the electrode plate 114 of the processing apparatus 40 in the wafer processing system 1 will be described with reference to FIG. 6. FIG. 6 is a schematic diagram illustrating an example of a captured image used in the monitoring process. The monitoring process is performed at a predetermined timing such as each time the etching process for one lot of wafers W is completed, and is performed in a state in which no wafer W is accommodated in the processing container 100. In addition, the processes of monitoring the electrode plates 114 of the processing apparatuses 41 to 43 are performed in the same manner as the process of monitoring the electrode plate 114 of the processing apparatus 40.

(Imaging Step)

First, the controller 50 linearly moves the fork 203b, which does not hold a wafer W, inside of the processing container 100 of the processing apparatus 40 in the radial direction of the wafer W during the etching process. The radial direction of the wafer W during the etching process coincides with the radial direction of the electrode plate 114. Hereinafter, the radial direction of the wafer W during the etching process will be referred to as the "wafer radial direction". Then, while the fork 203b is being moved as described above, the controller 50 causes a bottom surface of the electrode plate 114 to be illuminated with light from the light source 302 via the second light guide member 303b and the mirror 310, and causes the imaging device 301 to image the bottom surface of the plate 114 via the mirror 310 and the linear member 303. At this time, the imaging device 301 images multiple portions of the bottom surface of the electrode plate 114 in the wafer radial direction including a central portion facing the center of the wafer W during the etching process and a peripheral edge portion facing the peripheral edge side of the wafer W during the same process. In addition, the imaging device 301 images multiple (two in this example) ejection holes 114*a* at the same time for each of the multiple portions of the bottom surface of the electrode plate 114 using, for example, all of the effective pixels of the image sensor (not illustrated) of the imaging device 301. That is, as illustrated in FIG. 6, the captured image Im as the imaging result of the imaging device 301 includes two ejection holes 114*a* for each image. The first light guide member 303*a*, the mirror 310, and the like are provided so as to enable such imaging.

(Physical Amount Calculation Step)

Then, for each of the multiple portions of the electrode plate 114, the controller 50 calculates a diameter of the ejection holes 114*a* in the corresponding portion as a physical amount indicating a state of the corresponding portion based on the imaging results by the imaging device 301. Specifically, the controller 50 performs the following processes for each of the multiple portions. That is, the controller 50 performs predetermined processes such as pattern matching on the captured image Im obtained by the imaging device 301, and identifies the two ejection holes 114*a* included in the captured image Im. Next, the controller 50 calculates the number of pixels between predetermined portions (e.g., the centers) of the ejection holes 114*a* in the captured image Im, that is, the number of pixels indicating the pitch of the ejection holes 114*a* and the number of pixels indicating the diameter of each of the ejection holes 114*a*. Then, the controller 50 calculates the diameter of each of the ejection holes 114*a* based on the number of pixels indicating the pitch between the ejection holes 114*a*, the number of pixels indicating the diameter of each of the ejection holes 114*a*, and a design value of the pitch of the ejection holes 114*a* stored in advance in memory (not illustrated). The controller 50 performs such a process for each of the multiple portions.

As described above, by using the number of pixels indicating the pitch of the ejection holes 114*a* in the captured image Im and the design value of the pitch of the ejection holes 114*a* in the calculation of the diameter of each ejection hole 114*a*, the following effects are obtained. That is, the correspondence between the number of pixels and the actual size in the captured image Im may be reflected in the result of calculation of the diameter of each ejection hole 114*a*. Therefore, it is possible to accurately calculate the diameter of the ejection hole 114*a* even when the distance from the tip end of the linear member 303 to the bottom surface of the electrode plate 114 is not at a desired value due to sagging on the tip end side of the linear member 303 or the like.

(Replacement Determination Step)

Thereafter, the controller 50 determines whether to replace the electrode plate 114 based on the calculation result of the diameter of the ejection hole 114*a* for each of the multiple portions of the electrode plate 114. For example, when the diameter of any one of the ejection holes 114*a* or the average diameter of the ejection holes 114*a* exceeds the threshold in any one of the multiple portions of the electrode plate 114, the controller 50 determines that it is necessary to replace the plate 114. When it is determined that the replacement is necessary, notification indicating that the replacement is necessary is provided via a display device (not illustrated) or a sound output device (not illustrated) under the control of the controller 50.

(Processing Condition Adjustment Step)

When it is determined that it is not necessary to replace the electrode plate 114, the controller 50 changes conditions related to the processing gas during the etching process according to the calculated diameter of the ejection holes 114*a*. For example, when the diameter of the ejection holes 114*a* becomes larger than the initial diameter, a flow rate of the processing gas from the ejection holes 114*a* decreases, if the supply pressure of the processing gas to a gas diffusion space communicating with the corresponding ejection holes 114*a* is maintained as it is. Therefore, the controller 50 increases the supply pressure of the processing gas to the gas diffusion chamber 115*a* communicating with the corresponding ejection holes 114*a* among the gas diffusion chambers 115*a* divided in the radial direction, according to an amount of change from the initial diameter (that is, the consumption amount) of the ejection holes 114*a*. This makes it possible to eject the processing gas at a desired flow rate even from the ejection holes 114*a* having a large diameter, so that, for example, the wafer W can be uniformly etched within the wafer plane. In addition, it is possible to extend the life of the electrode plate 114 as a monitoring target member by changing the conditions related to the processing gas during the etching process.

As described above, in the present embodiment, the wafer processing system 1 includes the imaging device 301, which is provided in the wafer transfer mechanism 32 and images the electrode plate 114 as a monitoring target member inside the processing apparatus 40. Then, the controller 50 causes the imaging device 301 to image, for example, multiple portions of the electrode plate 114 inside the processing apparatus 40 in the wafer radial direction, including the central portion and the peripheral portion, by moving the holding arm 203. In addition, based on the imaging result, the controller 50 calculates and acquires the diameter of the ejection holes 114*a* in each of the multiple portions of the electrode plate 114 as a result of monitoring the state of the electrode plate 114.

Therefore, when determining whether or not it is necessary to replace the electrode plate 114 based on the above-mentioned result of monitoring the state of the electrode plate 114, it is possible to obtain an appropriate determination even if the state of the electrode plate 114 differs between the central portion and the peripheral portion. In addition, even when the state of the electrode plate 114 is different between the central portion and the peripheral portion, it is possible to appropriately obtain the desired etching result by changing the conditions of the processing gas during the etching process on the basis of the above-mentioned result from monitoring the state of the electrode plate 114. In the present embodiment, since the result of monitoring the state of the electrode plate 114 is obtained using the imaging unit 300 provided in the wafer transfer mechanism 32, it is not necessary to expose the processing container 100 to the air atmosphere when obtaining the result.

Furthermore, in the present embodiment, the imaging unit 300 is provided in the wafer transfer mechanism 32, specifically, in the transfer arm 32*a*. Therefore, by raising and lowering the transfer arm 32*a*, it is possible to focus the imaging device 301 on the monitoring target member.

Figure 7:
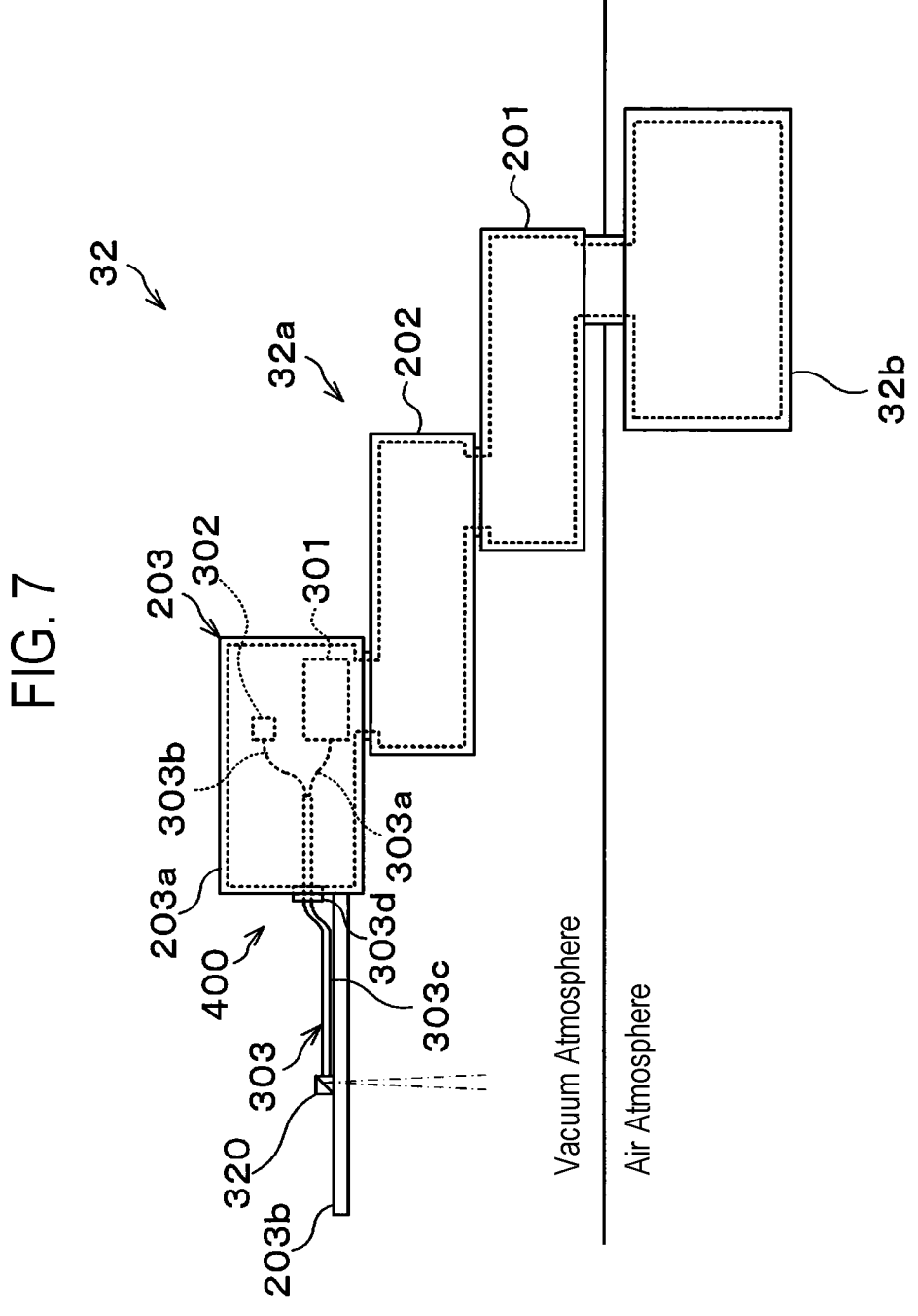
FIG. 7 is a view illustrating another example of an imaging unit.

FIG. 7 is a view illustrating another example of an imaging unit. The imaging unit 400 of FIG. 7 includes an imaging device 301, a light source 302, a linear member 303, and a mirror 320, like the imaging unit 400 of FIG. 4.

However, the mirror 320 in this example reflects downwards the light emitted from the light source 302 in the horizontal direction and emitted from the tip end of the second light guide member 303*b* of the composite cable 303*c*, and reflects the light from the lower side horizontally towards the tip end of the first light guide member 303*a* of the composite cable 303*c*, unlike the mirror 310 in FIG. 4.

In the imaging unit 400, the light source 302 illuminates the imaging target of the imaging device 301, that is, the monitoring target member, which is located below the fork 203*b*, via the second light guide member 303*b* and the mirror 320. In addition, in the imaging unit 400, the imaging device 301 receives the light, which is emitted from the imaging target, that is, the monitoring target member located below the fork 203*b*, reflected by the mirror 320, and guided by the first light guide member 303*a*, and captures an image.

In case of using such an imaging unit 400, for example, when the holding arm 203 is inserted into the processing container 100 of any of the processing apparatuses 40 to 43, the electrostatic chuck 104 located below the fork 203*b* becomes the monitoring target member. Specifically, the state of the top surface of the placement portion 104*a* of the electrostatic chuck 104 (which may also be referred to as a "wafer placement surface" below) is monitored.

When monitoring the state of the wafer placement surface, the controller 50 causes the imaging device 301 to image multiple portions of the wafer placement surface via the mirror 320 and the first light guide member 303*a* by moving the holding arm 203 inside the processing container 100. The multiple portions include a central portion facing the center of the wafer W during the etching process and a peripheral edge portion facing the peripheral edge side of the wafer W during the etching process.

Then, for each of the multiple portions of the wafer placement surface, the controller 50 calculates (the size of) the diameter of the convex portions 104*b* as a physical amount indicating the state of the corresponding portion based on the imaging results by the imaging device 301. That is, the controller 50 acquires (the information of) the diameter of the convex portions 104*b* in each of the multiple portions of the wafer placement surface as the result of monitoring the state of the wafer placement surface based on the imaging results by the imaging device 301.

Further, calculation of the diameter of the convex portions 104*b* as a physical amount indicating the state of each portion of the wafer placement surface is because the convex portions 104*b* are etched during cleaning.

In addition, based on the monitoring result of the state of the wafer placement surface, specifically, based on the diameter of the convex portions 104*b* in each of the multiple portions of the wafer placement surface, the controller 50 determines whether to replace the electrostatic chuck 104. For example, the controller 50 determines that it is necessary to replace the electrostatic chuck 104 when the diameter of the convex portions 104*b* exceeds a threshold in any one of the multiple portions of the wafer placement surface.

In addition, the controller 50 changes the conditions for the heaters 109 during the etching process according to the calculated diameter of the convex portions 104*b*. For example, in the case in which the diameter of the convex portions 104*b* has become smaller than the initial diameter thereof and thus the contact area between the convex portions 104*b* and the rear surface of the wafer W has decreased, if the heating amount of the region in which the corresponding convex portions 104*b* are located is maintained as it is, the temperature of the wafer W on the region may become lower than the target temperature. Therefore, the controller 50 changes the processing conditions of the heater 109 corresponding to the region in which the corresponding convex portions 104*b* are located such that the heating amount increases depending on the amount of change in the diameter of the convex portions 104*b* from the initial diameter. This makes it possible to set the wafer W on the region in which the diameter of the convex portions 104*b* has decreased to the target temperature. Thus, for example, it is possible to make the temperature of the wafer W uniform during the etching process within the wafer plane.

Further, when the imaging unit 400 is used, the controller 50 may cause the imaging device 301 to image a predetermined portion in each of the processing apparatuses 40 to 43 via the first light guide member 303*a* and to calculate the amount of the reaction product deposited during the etching process for the predetermined portion based on the imaging result. Specifically, for example, during the etching process, since the reaction by-product may be deposited on the peripheral side of the top surface of the placement portion 104*a* of the electrostatic chuck 104 (that is, the peripheral edge side of the wafer placement surface), the controller 50 may cause the imaging device 301 to image, for example, the peripheral edge side of the wafer placement surface via the mirror 320 and the first light guide member 303*a*. Then, the controller 50 may calculate the deposited amount (i.e., the thickness) of the reaction by-product deposited on the peripheral edge side of the wafer placement surface based on the captured images obtained by the imaging device 301.

The deposited amount is calculated, for example, as follows. The correspondence relationship between colors (concentrations) in a captured image and deposited amounts of the reaction product is acquired in advance and stored in memory (not illustrated), and the controller 50 calculates the deposited amount of the reaction by-product from an actual captured image and the corresponding relationship.

The controller 50 may determine whether to clean the peripheral edge side of the wafer placement surface based on the calculation result of the deposited amount of the reaction by-product. This is because, when the deposited amount of the reaction by-product increases and the film thickness due to the reaction by-product increases, the reaction by-product is peeled off from the wafer placement surface and generates particles. For example, when the calculated accumulation amount of the reaction by-product exceeds a threshold, the controller 50 determines that the peripheral edge side of the wafer placement surface is to be cleaned. When the controller 50 determines that the cleaning is to be performed, the controller 50 controls the gas supplier 120 to supply the cleaning gas into the processing container 100.

The imaging unit 400 may cause a portion of the processing container 100 other than the wafer placement surface (e.g., the focus ring 107) to be imaged and may calculate the deposited amount of the reaction by-product on the corresponding portion based on the imaging result.

Even when the imaging unit 300 of FIG. 4 is used instead of the imaging unit 400, the above-mentioned imaging and calculation for the deposited amount of the reaction by-product may be performed based on the imaging result. Specifically, the controller 50 may cause the imaging device 301 to image a predetermined portion in each of the processing apparatuses 40 to 43 via the mirror 310 and the first light guide member 303*a*, and may calculate the deposited amount of the reaction product for the predetermined portion based on the imaging result.

In the above-described examples, the imaging device 301 is provided inside of the accommodation part 203*a*, which is at an air atmosphere, on the base end side of the holding arm 203. The imaging device 301 may be provided in the base portion of the fork 203*b* as long as the imaging device 301 is also capable of operating under a reduced pressure. In this case, in order to keep the distance from the upper surface of the fork 203*b* to the top of the imaging device 301 to be equal to or less than an allowable value, a recess or a through hole into which the lower portion of the imaging device 301 is inserted may be provided in the base portion of the fork 203*b*. When the imaging device 301 is provided inside the accommodation part 203*a*, which is at an air atmosphere, on the base end side of the holding arm 203, it is possible to use an imaging device that does not operate under a reduced pressure but operates under an atmospheric pressure. Therefore, it is possible to prevent the wafer processing system 1 from becoming expensive.

In the case in which an imaging device capable of operating even under a reduced pressure is used as described above, a monitoring target member may be imaged while omitting the first light guide member 303*a* or the like, by mounting the imaging device on the fork 203*b* in a form in which the imaging device is linearly formed and a mirror is provided at the tip end thereof.

In the examples described above, the first light guide member 303*a* and the second light guide member 303*b* together form the linear member 303. Instead of this, each of the first light guide member 303*a* and the second light guide member 303*b* may be provided as an individual linear member and may be individually disposed on the holding arm 203.

In addition, in the examples described above, both the imaging unit 300 or 400 and the mirror 310 or 320 move together with the fork 203*b*. Instead of this, a monitoring target member may be imaged while omitting the first light guide member 303*a* or the like, by disposing a mirror on each monitoring target portion of the monitoring target member and by providing a mechanism capable of adjusting the field of view of the imaging device such that the mirror is included in the field of view, a mechanism capable of adjusting the focus of the imaging device such that the focus matches the monitoring target via this mirror, or the like.

In the examples described above, in the imaging unit 300 or 400, multiple portions of the monitoring target member are imaged in the radial direction thereof, but multiple portions of the monitoring target member may be imaged in the circumferential direction thereof. In addition, for each of the multiple portions, a physical amount indicating the state of the corresponding portion may be calculated based on the imaging results.

According to the present disclosure, in the case of monitoring the state of a member in a substrate processing apparatus without exposing the inside of the substrate processing apparatus to an air atmosphere, it is possible to obtain an appropriate result when the timing for replacing the above-mentioned member or the like is determined based on the monitoring result, even when the state of the above-mentioned member differs between the portion facing the center of the substrate and the portion facing the peripheral edge side of the substrate during the processing of the substrate.

It should be understood that the above-described embodiments disclosed herein are exemplary in all respects and are not restrictive. The above-described embodiments may be omitted, replaced, or modified in various forms without departing from the scope and spirit of the appended claims.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing system comprising:

a substrate processing apparatus configured to process a substrate and including a monitoring target member;

a substrate transfer mechanism including a substrate holder configured to hold the substrate, the substrate transfer mechanism being configured to hold the substrate on the substrate holder and to load and unload the substrate into and out of the substrate processing apparatus;

an image sensor provided in the substrate transfer mechanism and configured to image the monitoring target member;

a light source provided in the substrate transfer mechanism and configured to illuminate the monitoring target member;

a linear member configured to guide light incident from a tip end of the linear member to a base end of the linear member; and a controller, wherein the controller is configured to:

cause the image sensor to image multiple portions of the monitoring target member by moving the substrate holder, wherein the multiple portions of the monitoring target member includes a central portion of the monitoring target member which faces a center of the substrate during substrate processing and a peripheral edge portion of the monitoring target member which faces a peripheral edge side of the substrate during the substrate processing;

calculate a physical amount indicating a state of each of the multiple portions of the monitoring target member, based on an imaging result, wherein the physical amount includes a diameter of a target portion of each of the multiple portions; and determine whether to replace the monitoring target member or to change at least one substrate processing condition, according to the calculated diameter of the target portion, and wherein the linear member includes:

a first light guide member configured to guide light emitted from the monitoring target member;

a second light guide member configured to guide light emitted from the light source; and a composite cable formed on a tip end side of the linear member by putting the first light guide member together with the second light guide member, wherein the substrate holder includes a plurality of protrusions on a top surface of the substrate holder, the plurality of protrusions protruding upwards and configured to support a bottom surface of the substrate, wherein a diameter of the composite cable is smaller than heights of the plurality of protrusions, wherein the composite cable is located between the bottom surface of the substrate and the top surface of the substrate holder when the substrate is held by the substrate holder, wherein the light source and the image sensor are provided inside the substrate transfer mechanism having an air atmosphere, and wherein a feedthrough is formed at a portion of the composite cable that penetrates the substrate transfer mechanism such that a vacuum atmosphere of the substrate processing apparatus is not impaired.

2. The substrate processing system of claim 1, wherein the linear member is formed in a linear shape and disposed on the substrate holder, wherein the image sensor is configured to image the monitoring target member via the light guide member.

3. The substrate processing system of claim 2, wherein the image sensor is provided at a position in the substrate transfer mechanism at which the image sensor does not interfere with the substrate held by the substrate holder, and the linear member is formed in a linear shape and disposed on the substrate holder such that holding of the substrate by the substrate holder is not disturbed.

4. The substrate processing system of claim 3, wherein the monitoring target member is a member including, as the target portion, a plurality of ejection holes configured to discharge a processing gas towards the substrate during processing, and the diameter of the target portion is a diameter of the ejection holes.

5. The substrate processing system of claim 4, wherein the controller is configured to change a condition related to the processing gas during the processing according to the calculated diameter of the ejection holes.

6. The substrate processing system of claim 3, wherein the monitoring target member is an attractive holding member configured to attract and hold the substrate thereon and includes, as the target portion, a plurality of convex portions protruding on a substrate side thereof, and the diameter of the target portion is a diameter of the convex portions.

7. The substrate processing system of claim 6, wherein the attractive holding member is provided with a heater configured to adjust a temperature of the substrate, and the controller is configured to change a condition related to the heater during processing according to the calculated diameter of the convex portions.

8. The substrate processing system of claim 7, wherein the controller is further configured to:

cause the image sensor to image a predetermined portion inside the substrate processing apparatus, wherein the predetermined portion is different from the multiple portions; and calculate a deposited amount of a reaction product on the predetermined portion based on another imaging result.

9. The substrate processing system of claim 8, wherein the controller is further configured to determine whether to clean the predetermined portion based on a result of calculating the deposited amount.

10. The substrate processing system of claim 1, wherein the monitoring target member is a member including a plurality of ejection holes configured to discharge a processing gas towards the substrate during processing, and the diameter of the target portion is a diameter of the ejection holes.

11. The substrate processing system of claim 1, wherein the monitoring target member is an attractive holding member configured to attract and hold the substrate thereon and including a plurality of convex portions protruding on a substrate side thereof, and the diameter of the target portion is a diameter of the convex portions.

12. The substrate processing system of claim 1, wherein the controller is further configured to:

cause the image sensor to image a predetermined portion inside the substrate processing apparatus, wherein the predetermined portion is different from the multiple portions; and calculate a deposited amount of a reaction product on the predetermined portion based on another imaging result.

* * * * *